(12) United States Patent
Morita

(10) Patent No.: US 7,527,706 B2
(45) Date of Patent: May 5, 2009

(54) PLASMA PROCESSING APPARATUS, PROCESS VESSEL FOR PLASMA PROCESSING APPARATUS AND DIELECTRIC PLATE FOR PLASMA PROCESSING APPARATUS

(75) Inventor: Osamu Morita, Hyogo (JP)

(73) Assignee: Tokyo Electron Limited (JP)

( * ) Notice: Subject to any disclaimer, the term of this patent is extended or adjusted under 35 U.S.C. 154(b) by 373 days.

(21) Appl. No.: 11/101,598

(22) Filed: Apr. 8, 2005

(65) Prior Publication Data
US 2005/0172903 A1    Aug. 11, 2005

Related U.S. Application Data

(63) Continuation-in-part of application No. PCT/JP03/13051, filed on Oct. 10, 2003.

(30) Foreign Application Priority Data
Oct. 10, 2002    (JP)    ............... 2002-297689

(51) Int. Cl.
*C23C 16/00* (2006.01)
*C23F 1/00* (2006.01)
*H01L 21/306* (2006.01)

(52) U.S. Cl. .................. 156/345.41; 118/723 MW; 156/345.36

(58) Field of Classification Search ......... 118/723 MW, 118/723 I; 156/345.41, 345.48
See application file for complete search history.

(56) References Cited

U.S. PATENT DOCUMENTS 4,977,855 A * 12/1990 Ohmi et al. ............ 118/722
5,762,755 A * 6/1998 McNeilly et al. ............ 438/708
5,993,594 A * 11/1999 Wicker et al. .......... 156/345.34
6,357,385 B1 * 3/2002 Ohmi et al. ........... 118/723 AN
6,502,529 B2 * 1/2003 Herchen .............. 118/723 ME
2002/0020494 A1 * 2/2002 Yokogawa et al. .......... 156/345
2003/0194508 A1 * 10/2003 Carpenter et al. ........... 427/569

FOREIGN PATENT DOCUMENTS

| JP | 64-067908 | 3/1989 |
| JP | 06-096895 | 4/1994 |
| JP | 08-106993 | 4/1996 |
| JP | 2002-270599 | 9/2002 |

OTHER PUBLICATIONS

English translation of the International Preliminary Report on Patentability dt. Dec. 6, 2004.

* cited by examiner

*Primary Examiner*—Parviz Hassanzadeh
*Assistant Examiner*—Rakesh K Dhingra
(74) *Attorney, Agent, or Firm*—Finnegan, Henderson, Farabow, Garrett & Dunner, LLP

(57) ABSTRACT

According to the present invention, with an object of minimizing damage to a dielectric plate and a metal vessel and improving efficiency of plasma processing, a resin layer is disposed in an area where the dielectric plate and the process vessel face each other. This can reduce particles and damage ascribable to a difference in thermal expansion coefficient between the dielectric plate and the metal process vessel. Moreover, the occurrence of local discharge in an electric field boundary such as an edge portion of the dielectric plate is inhibited, resulting in improved efficiency of plasma processing such as film deposition of an oxide film.

8 Claims, 3 Drawing Sheets

PLASMA PROCESSING APPARATUS, PROCESS VESSEL FOR PLASMA PROCESSING APPARATUS AND DIELECTRIC PLATE FOR PLASMA PROCESSING APPARATUS

This is a continuation in part of PCT Application No. PCT/JP2003/013051, filed Oct. 10, 2003, which claims the benefit of a Japanese Patent Application No. 2002-297689, filed Oct. 10, 2002, all of which are incorporated herein by reference.

BACKGROUND OF THE INVENTION

1. Field of the Invention

The present invention relates to a plasma processing apparatus that processes a semiconductor substrate using plasma, and more particularly, to the structures of a process vessel and a dielectric plate for the plasma processing apparatus.

2. Description of the Related Art

Recent years have seen a remarkable progress in semiconductor processing technology using plasma. Plasma processing has merits such that its process temperature can be far lower than conventional process temperature. A plasma processing apparatus generally includes: a process vessel housing a semiconductor substrate; an electromagnetic wave supply part supplying an electromagnetic wave to the process vessel; and a dielectric plate (dielectric window) disposed between the electromagnetic supply part and the process vessel. In an apparatus with such a configuration, mixed gas appropriate for the processing is introduced into the process vessel and plasma is excited by the electromagnetic wave such as a microwave. A sealing means such as an O-ring is interposed between the dielectric plate and the process vessel to vacuum-seals the process vessel.

In such a conventional plasma processing apparatus, however, due to a difference in thermal expansion coefficient between the dielectric plate and the metal process vessel, particles ascribable to friction, chipping, and the like of the metal vessel are produced in a contact portion of the dielectric plate and the metal process vessel. In the worst case, the dielectric plate suffers damage such as breakage. Further, local discharge occurs in an electric field boundary such as an edge portion of the dielectric plate, which not only gives damage to the metal vessel but also lowers efficiency of plasma processing such as film deposition of an oxide film.

SUMMARY OF THE INVENTION

The present invention was made in view of the circumstances described above, and it is an object of the present invention to provide a plasma processing apparatus, a process vessel, and a dielectric plate with which damage to the dielectric plate and the metal vessel can be minimized and efficiency of plasma processing can be improved.

In order to achieve the above object, a plasma processing apparatus according to the present invention has a resin layer interposed between a dielectric plate and a process vessel. Consequently, the resin layer can reduce particles ascribable to friction/chipping caused by a difference in thermal expansion coefficient between the dielectric plate and the metal process vessel. Further, the occurrence of local discharge in an electric field boundary such as an edge portion of the dielectric plate is inhibited, which realizes improved efficiency of plasma processing such as film deposition of an oxide film.

DETAILED DESCRIPTION OF THE INVENTION

Figure 1:
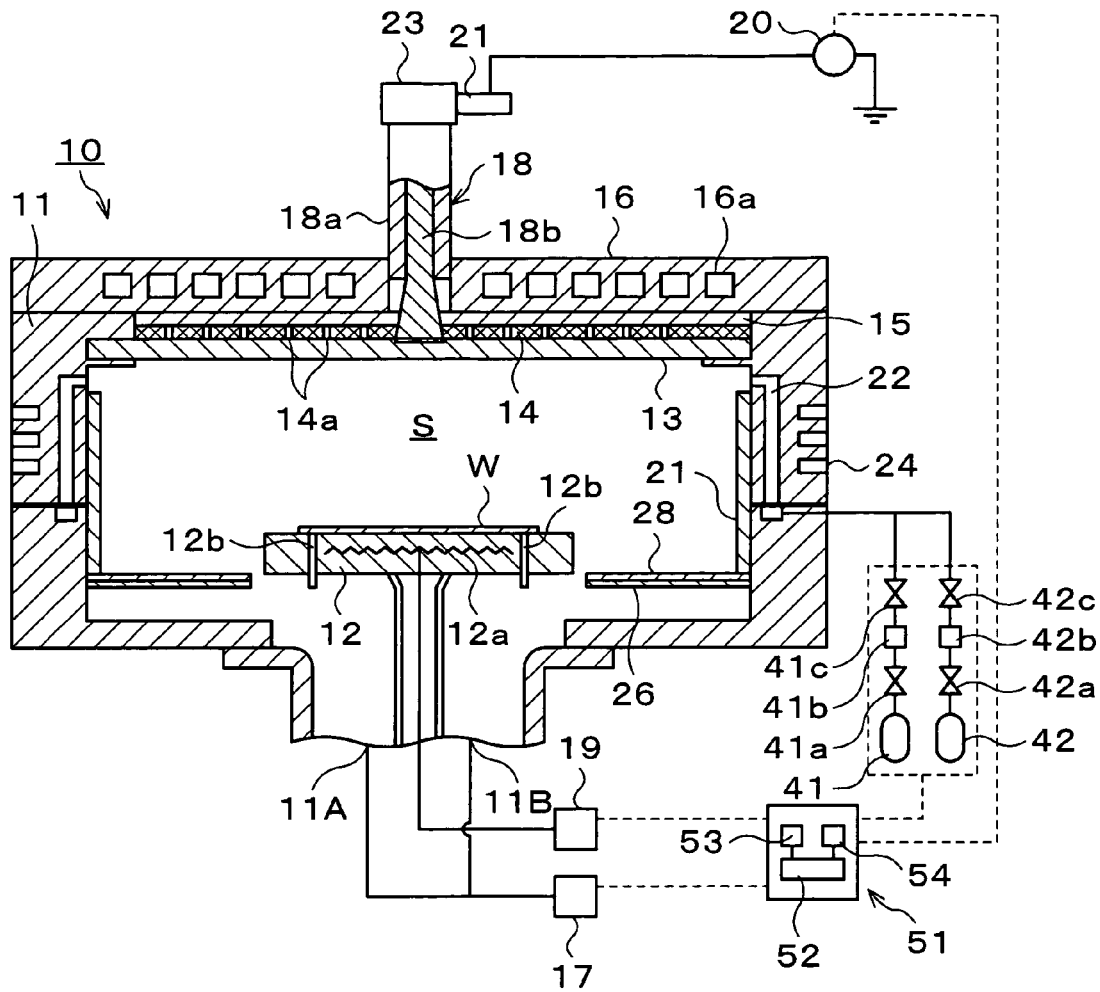
FIG. 1 is a schematic cross-sectional view showing an example of the configuration of a plasma processing apparatus according to an embodiment of the present invention.

FIG. 1 schematically shows the configuration of a plasma processing apparatus 10 used in the present invention. The plasma processing apparatus 10 has a process vessel 11 provided with a substrate holding table 12 for holding a silicon wafer W which is a substrate to be processed. Gas in the process vessel 11 is exhausted from exhaust ports 11A and 11B by an exhaust pump 17. The substrate holding table 12 has a heater 12a that is supplied with power from a power source 19 to heat the silicon wafer W, and is capable of heating the silicon wafer W to a desired temperature. The substrate holding table 12 further has a plurality of lift pins 12b at, for example, three places, the lift pins 12b being moved up/down by a driving source (not shown) such as a motor to be capable of lifting down the silicon waver W onto the substrate holding table 12 and lifting up the silicon wafer W off the substrate holding table 12.

The process vessel 11 has an opening formed in an upper portion of the apparatus at a position corresponding to the silicon wafer W on the substrate holding table 12. This opening is airtightly closed by a dielectric plate 13 made of quartz, $Al_2O_3$, AlN, or the like. On an upper face (on an outer side) of the dielectric plate 13, a planar slot plate 14 functioning as an antenna is provided. The slot plate 14 has a large number of openings 14a such as slits or holes which are arranged spirally or coaxially. On an upper face (on an outer side) of the slot plate 14, disposed is a dielectric plate 15 made of fluorine resin such as Teflon (registered trademark of DuPont, USA), engineering plastic of polyimide resin or the like such as Vespel (registered trademark of DuPont, USA), quartz, alumina, aluminum nitride, or the like. This dielectric plate 15 is sometimes called as a retardation plate or a wavelength shortening plate. On an upper face (on an outer side) of the dielectric plate 15, a cooling plate 16 is disposed. The cooling plate 16 has therein a refrigerant path 16a in which a refrigerant flows. This cooling plate 16 cools the dielectric plate 13, the slot plate 14, and the dielectric plate 15 to prevent these members from deforming due to the temperature of plasma, resulting in generation of stable plasma. Further, a coaxial waveguide 18 introducing a microwave is provided at an upper edge center portion of the process vessel 11. The coaxial waveguide 18 is constituted of an outer conductor 18a and an inner conductor 18b.

A slot plate 14-side end portion of the internal conductor 18b of the coaxial waveguide 18 has a conical shape so that the microwave propagates efficiently in a horizontal direction to the slot plate 14. The coaxial waveguide 18 guides the microwave as an electromagnetic wave of, for example, 2.45 GHz generated in a microwave supply device 20 so that the microwave transmits through the dielectric plate 13 via a rectangular waveguide 21, a mode converter 23, the coaxial waveguide 18, the dielectric plate 15, and the slot plate 14 to be emitted into the process vessel 11.

On an inner wall of the process vessel 11, gas introducing parts, for example, gas nozzles 22 for introducing gases used for plasma processing are provided at equal intervals. Similarly, inside the inner wall of the process vessel 11, refrigerant paths 24 are formed to surround the entire vessel. The process gases from process gas supply sources provided outside the process vessel 11 are supplied uniformly to the gas nozzles 22. In this embodiment, as the process gas supply sources, an argon gas supply source 41 and an oxygen gas supply source 42 are prepared, and they are connected to the gas nozzles 22 via valves 41a, 42a, massflow controllers 41b; 42b and valves 41c, 42c, respectively Energy of the microwave propagating to the aforesaid dielectric plate 13 forms an electric field on a lower face of the dielectric plate 13 to plasmatize the process gasses which are supplied by the gas nozzles 22 to a process space S in the process vessel 11, so that plasma processing is applied to the silicon wafer W on the substrate holding table 12.

Around the substrate holding table 12, a gas baffle plate (partition plate) 26 made of aluminum is disposed. A quartz cover 28 is provided on an upper face of the gas baffle plate 26.

The plasma processing apparatus 10 as configured above is controlled by a controller 51. The controller 51 has a central processing unit 52, a support circuit 53, and a storage medium 54 including associated control software. The controller 51 controls, for example, the supply, termination, and flow rate adjustment of the gases from the gas nozzles 22, temperature adjustment of the heater 12a, the exhaust by the exhaust pump 17, the microwave supply device 20, and so on, thereby performing control operations as required in each process for the plasma processing in the plasma processing apparatus 10.

As the central processing unit 52 of the controller 51, a processor of a general-use computer is usable. As the storage medium 54, any of various types of recording media such as, for example, a RAM, a ROM, a flexible disk, and a hard disk is usable. The support circuit 53 is connected to the central processing unit 52 in order to support the processor in various ways.

When the plasma processing using this plasma processing apparatus 10 is to be applied, after the silicon wafer W is set on the substrate holding table 12 in the process vessel 11 of the plasma processing apparatus 10, air in the process vessel 11 is first exhausted through the exhaust ports 11A, 11B so that the inside of the process vessel 11 is set to a predetermined process pressure. Thereafter, predetermined mixed gas (for example, inert gas, oxygen gas, nitrogen gas, film deposition gas, or the like) is introduced from the gas nozzles 22 into the process vessel 11 in which the silicon wafer W is set (loaded).

Meanwhile, the microwave of several GHz frequency supplied through the coaxial waveguide 18 is introduced into the process vessel 11 via the dielectric plate 15, the slot plate 14, and the dielectric plate 13. This microwave excites plasma generating gas to generate plasma in the process space S.

The high-density plasma generated in the process vessel 11 by the microwave excitation oxidizes a surface of the silicon wafer W by, for example, generated active O, so that an oxide film is grown.

Figure 2:
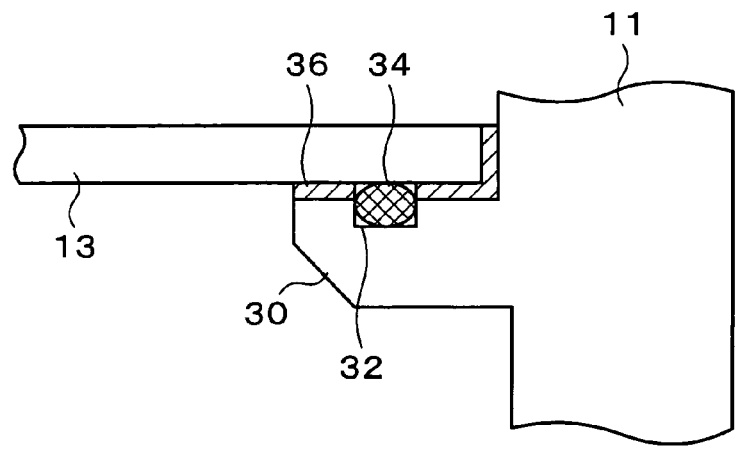
FIG. 2 is a cross-sectional view showing the structure of an essential portion of the embodiment.

FIG. 2 shows a view of the vicinity of an area where the dielectric plate 13 and the process vessel 11 face each other. The process vessel 11 has on its inner wall side a support part 30 protruding in a flange shape (ring shape) to support the dielectric plate 13. In an upper face of the support part 30, a groove 32 in which an O-ring 34 is fitted is formed. An outer peripheral portion of the dielectric plate 13 is supported on the support part 30. A resin layer 36 is formed in the area where the dielectric plate 13 and the process vessel 11 face each other (a contact area).

A material of the process vessel 11 is metal, for example, aluminum, SUS, or the like. On the other hand, as a material of the resin layer 36, usable is fluorine resin such as Teflon (registered trademark of DuPont, USA) or engineering plastic made of polyimide resin or the like. It is preferable to select the material of the resin layer 36 according to conditions of the plasma processing, that is, kind of reactive gas, set temperature, and the like. A method of forming the resin layer 36 may be coating/baking, and a method of bonding a different member (resin film) is also adoptable.

The resin layer 36 preferably has a thickness of, for example, 40 μm to 100 μm. The resin layer 36 whose thickness is over 100 μm is difficult to form by coating. On the other hand, the resin layer 36 whose thickness is less than 40 μm tends to be inferior in insulating performance.

Incidentally, the resin layer 36 can be formed either on a surface of the process vessel 11 or on a surface of the dielectric plate 13. However, when coating is adopted for forming the resin layer 36 and high-temperature baked resin and low heat-resistance metal are used as materials of the resin layer 36 and the process vessel 11 respectively, forming the resin layer 36 on the dielectric plate 13 side is easier as a process.

As described above, providing the resin layer 36 reduces damage such as friction, chipping, and the like ascribable to a difference in thermal expansion coefficient between the dielectric plate 13 and the metal process vessel 11, and also inhibits local discharge from occurring in an electric field boundary such as an edge portion of the dielectric plate 13. As a result, the damage to the metal process vessel 11 can be reduced. Moreover, it is possible to improve efficiency of plasma processing such as film deposition of an oxide film. Note that the present invention is especially effective in a process where high-power (for example 3 kW or more) plasma is used for processing the silicon wafer W.

Figure 3:
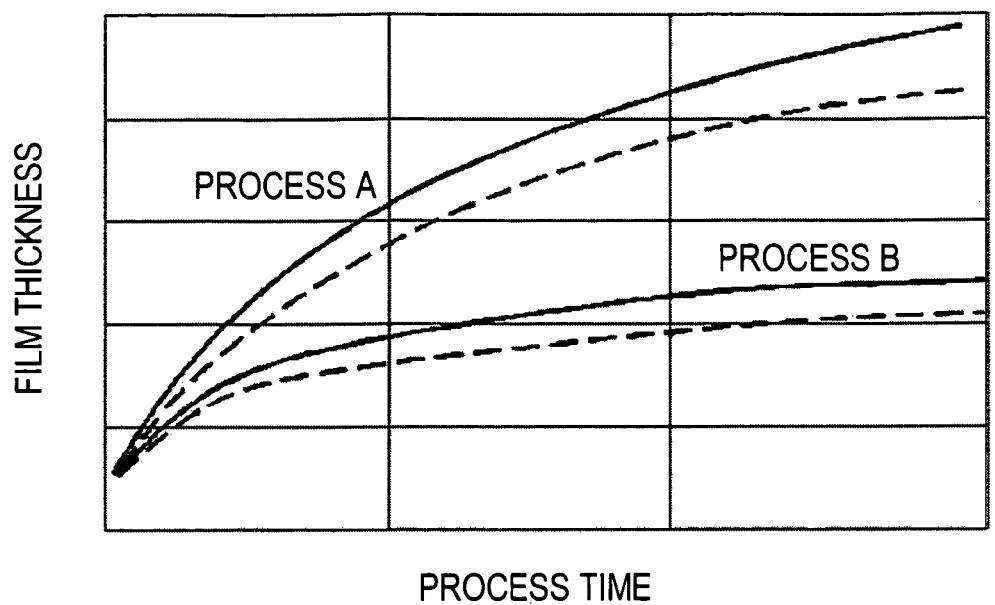
FIG. 3 is a graph showing an effect of the embodiment and it shows the correlation between process time and film thickness.

FIG. 3 shows how film thickness changes in correlation to process time in two different film deposition processes A and B. In the drawing, the solid line shows the result of the present invention where the resin layer is provided and the broken line shows the result of a conventional art where the resin layer is not provided. As is seen from the graph, the present invention achieves about 25% improvement on the average in film deposition efficiency since the occurrence of the local discharge in the electric field boundary such as the edge portion of the dielectric plate 13 is inhibited.

Figure 4:
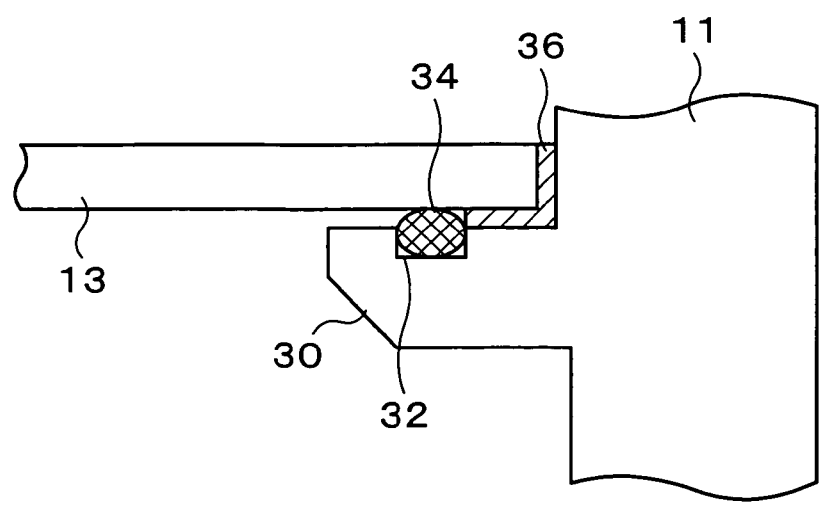
FIG. 4 is a cross-sectional view showing the structure of an essential portion of another embodiment.

FIG. 4 shows another example of the formation position of the resin layer 36 in the area where the dielectric plate 13 and the process vessel 11 face each other. In the example in FIG. 4, the resin layer 36 is formed only in an area on an outer side of the groove 32 and is not formed in an area on an inner side of the groove 32 (on an inner side of the vessel). Such arrangement can prevent that the resin layer 36 itself suffers damage due to conditions of plasma to cause the occurrence of particles as in a case where $O_2$ plasma is used. In the example in FIG. 4 similarly to the case in FIG. 2, the resin layer 36 may be formed either on the surface of the process vessel 11 or on the surface of the dielectric plate 13. Surface roughness of the area coated with the resin layer on the surface of the dielectric plate 13 is preferably Ra=0.5 mm to 1.5 mm in view of adhesion to a coating material.

During the plasma processing, the temperature of the dielectric plate 13, the support part 30, and the resin layer 36 becomes high and, as a result, particles are produced due to rubbing, friction, or the like, which may possibly contaminate the inside of the process vessel 11 to affect the processing.

Figure 5A:
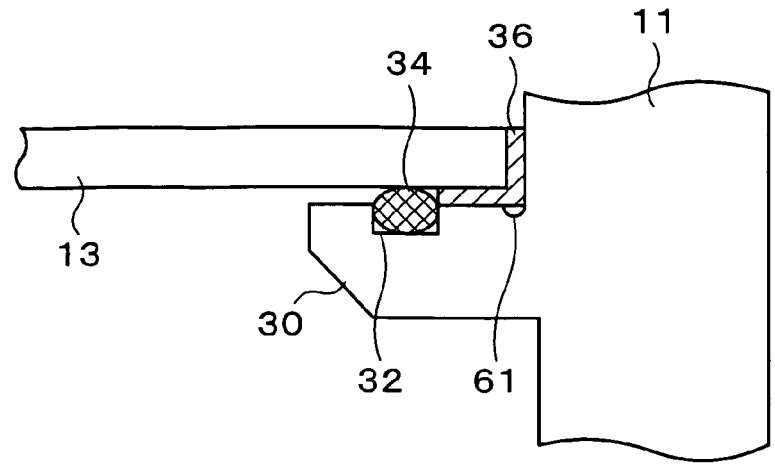
FIG. 5A, FIG. 5B, and FIG. 5C are cross-sectional views showing structures of an essential portion of still another embodiment of the present invention, FIG. 5A showing an example where a groove for absorbing thermal expansion is formed on an upper face of a support part, FIG. 5B showing an example where the groove for absorbing thermal expansion is formed on a side face of the support part on a dielectric plate side, and FIG. 5C showing an example where the groove for absorbing thermal expansion is formed in a corner portion of the support part.
Figure 5B:
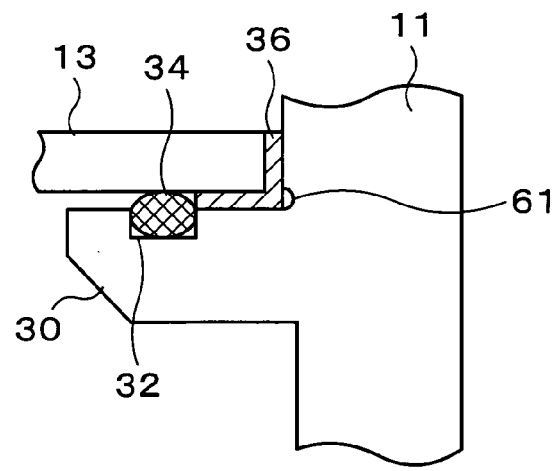
Figure 5C:
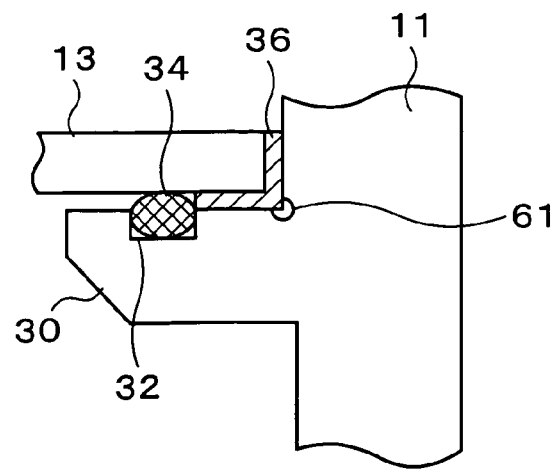

As a countermeasure against this, a groove 61 for absorbing thermal expansion of these members is preferably formed in the support part 30, as shown in, for example, FIG. 5A. This groove 61 is formed on an outer side of the groove 32 formed on the support part 30 and it is formed in a ring shape along the entire periphery of the support part 30. The groove 61 may have a cross section in a curved shape such as a circular shape or a semicircular shape, or in a polygonal shape such as a quadrangular shape. Thus forming the groove 61 enables absorption of thermal expansion of the dielectric plate 13, the support part 30, the resin layer 36, and so on. That is, this groove 61 can let expanded portions therein. The groove 61 is preferably formed on a base side of the support part 30, that is, at a position closer to the inner wall of the process vessel 11. For example, as shown in FIG. 5B, the groove 61 may be formed on a side wall of the support part 30 on a dielectric plate 13 side, or as shown in FIG. 5C, the groove 61 may be formed in a corner portion of the support part 30.

As has been described hitherto, according to the present invention, the resin layer is provided in the area where the dielectric plate and the process vessel face each other, so that the occurrence of particles due to friction, chipping, or the like ascribable to the difference in thermal expansion coefficient between the dielectric plate and the process vessel is reduced, and the occurrence of local discharge in the electric field boundary such as the edge portion of the dielectric plate is inhibited. As a result, damage to the metal process vessel can be reduced. Besides, it is possible to improve efficiency of the plasma processing such as film deposition of an oxide film.

The present invention is useful in a plasma processing apparatus having a dielectric plate and a metal process vessel, and is also applicable to a plasma etching apparatus and a plasma CVD apparatus.

What is claimed is:

1. A plasma processing apparatus applying plasma processing to a semiconductor substrate, comprising:
    a process vessel housing the semiconductor substrate to be processed;
    an electromagnetic wave supply part supplying an electromagnetic wave for generating plasma in a process space of said process vessel;
    a dielectric plate closing an opening formed in an upper portion of said process vessel;
    a support part on an inner wall side of the process vessel protruding into an inner side of the process vessel to support an outer peripheral portion of said dielectric plate on an upper face of said support part;
    a sealing material disposed between said dielectric plate and said support part, wherein the sealing part is located in a first groove formed in the support part;
    and
    a resin layer interposed in an area on an inner side of the sealing material or in an area on an outer side of the sealing material, and between said dielectric plate and said support part,
    wherein an area in which the upper face of said support part on an outer side of the sealing material and the dielectric plate face each other, and an area in which the inner side of the process vessel and the outer peripheral portion of the dielectric plate face each other, are contacted through said resin layer,
    wherein a second groove for absorbing thermal expansion is formed in the support part in an area having the resin layer, the groove being disposed in a corner portion between a side face of the support part and a base portion of the support part, or in an area of the side face of the support part being immediately adjacent to said corner portion or in an area of the base portion of the support part being immediately adjacent to said corner portion.

2. The plasma processing apparatus as set forth in claim 1, wherein said resin layer is formed on said dielectric plate.

3. The plasma processing apparatus as set forth in claim 1, wherein said resin layer has a thickness of 40 μm to 100 μm.

4. The plasma processing apparatus as set forth in claim 1, wherein said resin layer is disposed both in an area on an inner side of the sealing material and in an area on an outer side of the sealing material.

5. The dielectric plate of claim 1 which is used in a plasma processing apparatus applying predetermined processing to a semiconductor substrate by plasma excited in a process vessel and through which an electromagnetic wave to excite the plasma transmits when the electromagnetic wave is introduced,
    wherein a resin layer is disposed on both an outer peripheral portion of said dielectric plate and support face supported on said process vessel of said dielectric plate, and
    wherein the resin layer has a thickness of 40 μm to 100 μm.

6. The dielectric plate as set forth in claim 5,
    said dielectric plate being made of one of quartz, alumina, and aluminum nitride.

7. The dielectric plate as set forth in claim 5,
    wherein said electromagnetic wave is a microwave.

8. The plasma processing apparatus as set forth in claim 1, wherein said electromagnetic wave is a microwave.

* * * * *